United States Patent [19]

Beery et al.

[11] 3,988,664
[45] Oct. 26, 1976

[54] SYSTEM FOR PREDICTING OR DETECTING A FAULT IN A SOLENOID UTILIZATION SYSTEM

[75] Inventors: Jack Beery, Farmington; Daniel A. Wisner, Milan, both of Mich.

[73] Assignee: Burroughs Corporation, Detroit, Mich.

[22] Filed: Feb. 18, 1975

[21] Appl. No.: 550,595

[52] U.S. Cl............................ 324/28 R; 324/28 CR
[51] Int. Cl.²........................................ G01R 31/02
[58] Field of Search......... 324/28 R, 28 CR, 28 CB, 324/57 R

[56] References Cited
UNITED STATES PATENTS

| | | | |
|---|---|---|---|
| 3,535,620 | 10/1970 | Johnson | 324/28 R |
| 3,588,680 | 6/1971 | Athey | 324/28 R |

*Primary Examiner*—R. V. Rolinec
*Assistant Examiner*—Michael J. Tokar
*Attorney, Agent, or Firm*—Ronald L. Taylor; Charles P. Padgett, Jr.; Carl Fissell, Jr.

[57] ABSTRACT

A system for detecting the occurrence of a fault in a solenoid utilization system when the fault is manifested by the solenoid armature or plunger being seated either too early or too late. A predetermined time interval is established such that the seating of the solenoid armature or plunger during this time interval is regarded as acceptable. A cusp detector circuit detects the point in time at which the solenoid plunger or armature seats and if it is within this predetermined time interval, it is recognized as acceptable, but if it is detected either too early or too late, an indication is generated that a fault exists and the occurrence and probable nature of the fault may be flagged. A test mode is provided whereby the predetermined established time interval can be considerably narrowed so that maintenance can be performed on the system so as to insure that the solenoid armature or plunger seats at exactly the proper time. As the predetermined time interval is narrowed, the acceptable range is narrowed and if the solenoid armature or plunger is found to seat a little too early or too late, it can be taken as an indication that a future failure is to be anticipated unless maintenance is performed. The system can then be recalibrated to insure that the solenoid armature or plunger seats at the proper time thereby averting a future failure.

2 Claims, 19 Drawing Figures

FIG. I.
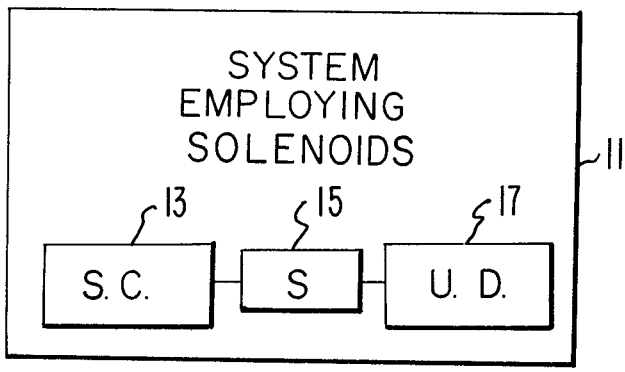
PRIOR ART
FIG. 2.
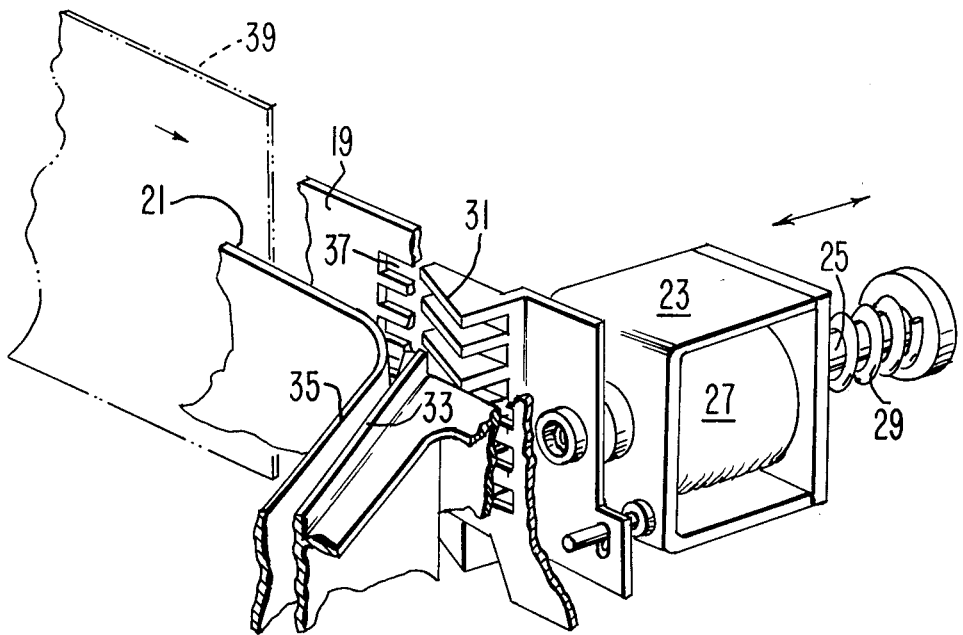
PRIOR ART

SYSTEM FOR PREDICTING OR DETECTING A FAULT IN A SOLENOID UTILIZATION SYSTEM

BACKGROUND OF THE INVENTION

This invention relates generally to fault anticipation or detection systems and more particularly to such systems employed in solenoid utilization systems.

Many systems in the prior art utilize electromechanical solenoids to perform various functions. Solenoid-actuated print hammers are often used in printing systems; solenoid-operated diverter gates are often used in card sorting equipment; and record card feeding devices often employ solenoid-operated pickers. Many such systems exist and are subject to various types of failures which occur whenever a solenoid fails to actuate; fails to return after actuation; actuates too early; or actuates too late. Depending on the type of system in which the solenoid is utilized, print hammers may lack sufficient energy to print the proper characters, card feeding devices may jam, and sorters may yield an improper sort, may jam or may otherwise damage the documents. In most cases, the first indication of such a failure is manifested when characters which were to be printed are found to be lacking on the print medium; when a jam detection system flashes an indication of a jam; or when documents become mutilated, etc. Improper sorts due to the failure of solenoid-operated pocket gates often go undetected resulting in considerable cost and expense should later corrections be necessary.

SUMMARY OF THE INVENTION

It is an object of this invention to provide a fault detection system for use in systems employing solenoids.

It is a further object of the present invention to provide a system for anticipating a possible future failure of a solenoid to seat at a desired setting time.

It is still a further object of the present invention to provide an electronic circuit for detecting the time of seating of a solenoid and for determining whether or not a fault exists in response to that detected seating time.

It is yet a further object of the present invention to establish a predetermined time interval during which the seating of a solenoid plunger will be deemed to be acceptable and outside of which a fault will be presumed to have occurred and to provide circuit means for detecting the time of seating of the solenoid with respect to this established time interval.

It is yet a further object of the present invention to provide a test circuit for reducing the predetermined time interval to a narrow range during which the seating of a solenoid armature or plunger is to occur so that if seating occurs outside this narrow acceptable range, a tendency toward a possible future failure may be detected so that a proper adjustment can be made before an actual failure occurs.

It is yet another object of the present invention to provide a fault detection circuit for use in a solenoid utilization system wherein a cusp detector is used to detect the time at which the solenoid plunger or armature is seated and wherein a time interval may be established during which a detected time of seating will be deemed to be acceptable and outside of which a fault will be deemed to have occurred.

These and other objects of the present invention are accomplished in a solenoid utilization system wherein a solenoid is energized in response to an external signal. As the solenoid is energized, the armature or plunger is pulled in toward the seated position as the current rises in the solenoid. At some point in the pull in, the reluctance of the circuit is changing faster than the current is able to build in the solenoid coil. At this point the current through the solenoid coil begins to fail until the solenoid is seated. As soon as the solenoid armature or plunger is seated, the current once more begins to build in the coil. A cusp detector circuit responsive to the current through the solenoid coil detects the point at which the reluctance ceases to change and the solenoid plunger is fully seated and generates a signal indicative of the solenoid plunger or armature having seated. A second input pulse is generated in association with the initial solenoid energization pulse and used to establish a predetermined time interval. If the signal indicative of the occurrence of the seating of the solenoid armature or plunger occurs during this predetermined time interval, the circuit is deemed to be operating in an acceptable manner. The system detects the early occurrence of such a pulse and/or the late occurrence of such a pulse (either inside or outside said predetermined interval of time) and generates an indication of the occurrence of a fault and possibly an indication of the nature of the fault depending on the nature of the utilization system. The system is further provided with a test mode wherein the width of the time interval during which the occurrence of said pulse will be deemed to be acceptable may be narrowed so that minor variations from the exact desired time of seating may be detected and taken as an anticipation of or tendency toward a possible future failure so that maintenance may be performed on the system so as to recalibrate the solenoid to once more seat at the proper time thereby preventing the occurrence of a future failure.

BRIEF DESCRIPTION OF THE DRAWINGS

Other objects, advantages and features of this invention will become more fully apparent from the following detailed description, appended claims and accompanying drawings in which like reference numerals designate corresponding parts:

FIG. 1 shows a block diagram of a prior art system employing a solenoid control system, a solenoid, and a solenoid utilization device;

FIG. 2 shows a perspective view of a solenoid-operated pocket gate used in a check sorter system of the prior art;

DETAILED DESCRIPTION OF THE INVENTION

Figure 3:
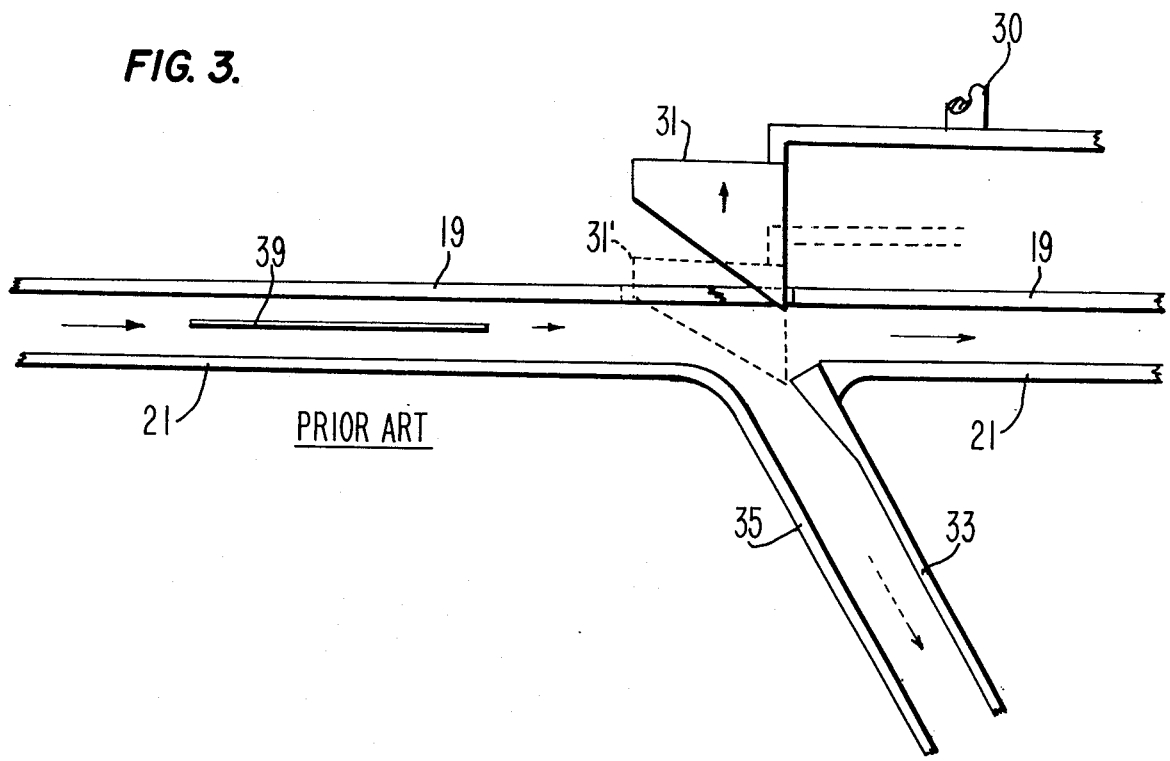
FIG. 3 shows a top view of a sorter track of FIG. 2 with the gate in a position for passing a document along the first path when in the retracted position and for diverting a document into a pocket when actuated to a second position.

FIG. 1 shows a block 11 representing any system of the prior art employing solenoids. This block 11 could represent a sorter system employing solenoid-operated pocket gates; a printer system employing solenoid-actuated print hammers; a card feeder system employing solenoid-operated pickers; or any system of the prior art which employs solenoid-like devices. The system of block 11 is shown as containing a solenoid control system represented by block 13, a solenoid 15, and a solenoid utilization device 17.

FIG. 2 shows an example of a solenoid and utilization device wherein the system of block 11 would be an encoder-sorter such as the Burroughs S200; wherein the solenoid of block 15 would be the pocket gate control solenoid of FIG. 2 and wherein the utilization device would be a pocket gate control mechanism. In FIG. 2, the members 19 and 21 form the walls of a passageway which define the path of travel of a document such as a record or check 39 which would normally travel in the direction of the arrow along the transport path between the walls 19 and 21. Under normal conditions, the solenoid assembly 23 would have its plunger 25 biased away from the seated position and out of the center of the solenoid coil 27 via spring 29. As long as the solenoid coil 27 remains de-energized, the solenoid plunger 25 remains biased to the right of the center of the coil 27 but within its magnetic circuit. As known in the art, the end of the solenoid plunger which is within the coil 27 may have attached thereto a non-magnetic push rod 30 which is then coupled to the pocket gate deflector mechanism 31 such that the gate mechanism 31 is positioned away from the slotted openings 37 of the wall 19 and out of the path of travel of the document 39 so as to allow the record card or document 39 to travel the first document transport path in the direction of the arrow. Should it be desired to divert an oncoming document into a pocket, not shown but known in the art, the document must be diverted to the pocket transport path defined by the walls 33 and 35. In order to accomplish this, the solenoid coil 27 is energized so as to draw the plunger 29 back into the center of the solenoid coil 27, causing the diverter gate mechanism 31 to be moved through the slotted openings 37 of the wall 19 so as to block the travel of the document in the first transport path when the plunger has seated, to push the deflector and divert the document into the second pocket transport path defined by walls 33 and 35.

FIG. 3 is an illustration of the top view of the solenoid utilization device of FIG. 2 and may be used in understanding the operation of such a device. A record card or check 39 is moving in the direction shown by the arrows in FIG. 3, along the first document transport path defined by the walls 19 and 21. If it is desired that the document 39 continue along the first transport path defined by the solid arrows, the solenoid mechanism 23 of FIG. 2 will withhold the solenoid-actuated diverter gate deflector 31 in the retracted position as shown in solid lines, out of the path of the document thereby allowing it to pass along the first transport path. Should it be desired, however, to divert the document into the sorter pocket transport path defined by walls 33 and 35, the solenoid 23 is actuated by energizing the coil 27 so as to seat the plunger 25 and move the gate deflector mechanism 31' into the position shown by the dotted lines of FIG. 3. The deflector 31 then blocks the first transport path defined by the walls 19 and 21 so that the oncoming document 39 will strike the diverter surface of the deflector mechanism 31 and be diverted into the pocket transport path defined by the walls 33 and 35 as shown by the dotted arrow of FIG. 3.

The mechanism shown in FIGS. 2 and 3 is shown as but one example of a solenoid utilization device to which the present invention is applicable. It will be recognized by those skilled in the art that it is highly desirable and often absolutely essential that the solenoid plunger or armature seat at a predetermined time after energization. In the case of a sorter pocket gate actuator, if the solenoid is pulled in too early such that the seating occurs too quickly, a failure may occur since an early pull-in indicates that the solenoid had not fully returned to the home position on its previous actuation whereas a late pull-in or late seating of the solenoid armature may indicate a total failure to actuate the pocket gate resulting in an erroneous sort or in a jam which can cause system failure and possible mutilation of the documents to be sorted.

Figure 4:
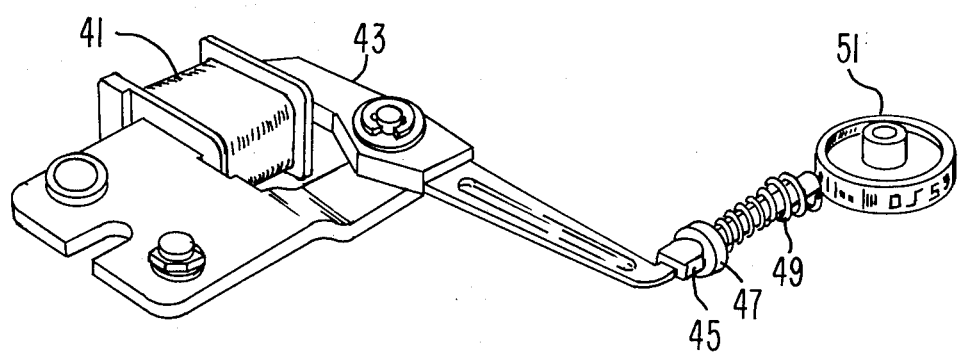
FIG. 4 shows a perspective diagram of another embodiment of a utilization device wherein a solenoid-operated hammer actuator is used to impell a print hammer toward a print wheel in a serial printing system.

FIG. 4 shows another example of a prior art solenoid utilization device. In this example, the energization of a solenoid coil 41 will cause the hammer actuating armature 43 to be drawn toward the seated position in the coil causing the striker end of the hammer actuator 45 to impart a predetermined amount of force to a hammer 47 which is spring biased into a normal contact position against the striker 45 of the hammer actuator by a biasing spring 49. The amount of energy imparted to the print hammer is critical in that proper print definition is dependent upon the energy at impact, which is given by the equation $E = \frac{1}{2} MV^2$. Since the mass of the hammer is constant and usually insignificant with respect to the velocity, and since the velocity is squared, the velocity imparted to the hammer will determine whether or not the character is sufficiently defined. If the proper launch velocity is imparted to the hammer 47 by the hammer actuator 43, the hammer 47 will strike the paper against the print wheel 51 with sufficient energy to insure proper character definition. If the solenoid armature seats too early, it will indicate that the actuator had not completely returned to its home position on the previous stroke thereby indicating that insufficient energy was imparted to the hammer on the current stroke. This results from the fact that the armature is initially positioned too close to the seated position such that it could not be accelerated sufficiently in the distance remaining to the seated position in order to achieve the necessary launch velocity. An early seating may also indicate a lack of damping on the part of the hammer since the hammer may have bounced out away from the strike end of the actuator such that the actuation stroke would impart a lesser energy to the hammer since it will have slowed before launch contact is made with the result that the character would not be printed at all or would have insufficient clarity or definition. If, on the other hand, the armature were to seat too late, we would again know that a fault exists and that characters were either not printed or printed with insufficient definition, since the hammer would not receive sufficient energy due to insufficient acceleration if the armature were reacting slowly or if a bind condition exists. In any event, either an early seating or late seating indicates that an error or fault has occurred in the system, and depending upon the nature of the system, and whether or not the seating was early or late we are often able to determine the precise nature of the fault as indicated by the examples given above.

Figure 5:
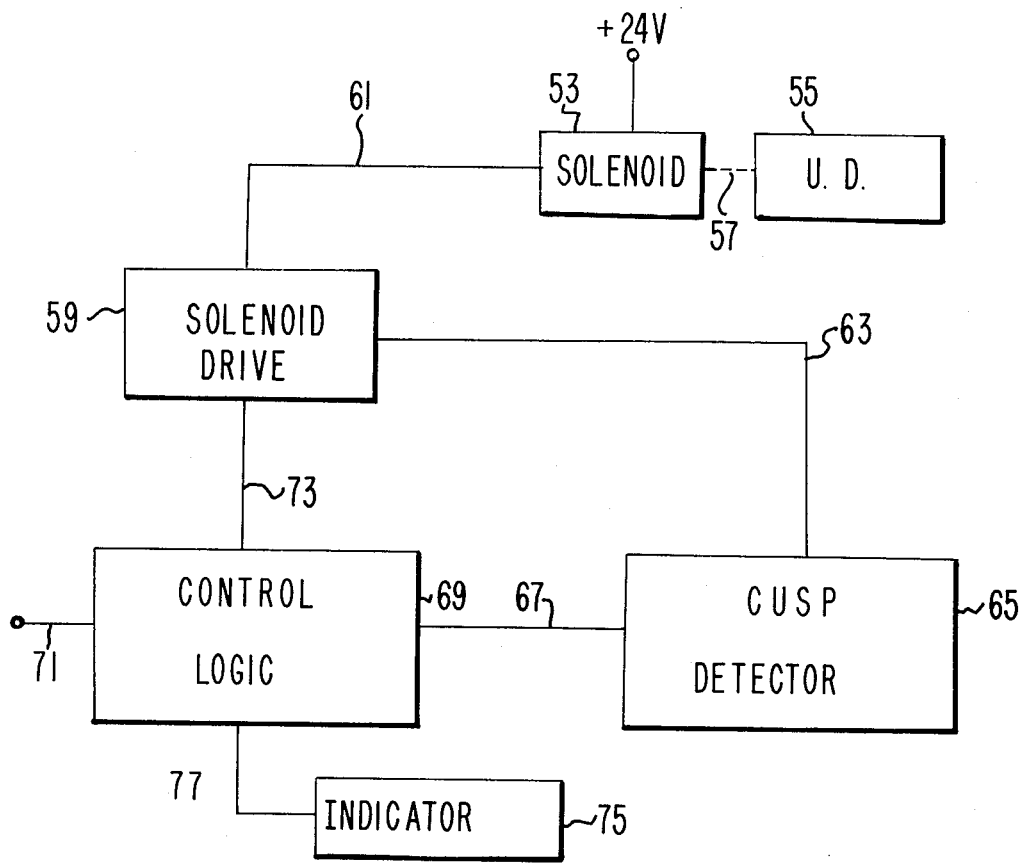
FIG. 5 shows a block diagram of a solenoid utilization system employing the present invention.

FIG. 5 represents a block diagram of a solenoid utilization system employing the present invention. Block 53 represents a solenoid which is connected to a +24 volt source of D.C. potential and whose energization or de-energization performs work in the utilization device represented by block 55. The utilization device is coupled to the solenoid by coupling 57 which may represent the solenoid plunger, mechanical linkage, a non-magnetic push rod associated with the plunger, or the like; and the utilization device of block 55 may be either of the examples described in FIGS. 2 or 4 or any of the many other utilization devices known in the art. The solenoid of block 23 is coupled to the solenoid drive circuit of block 59 via lead 61. The solenoid drive circuit of block 59 may be used to energize or de-energize the solenoid coil of the solenoid of block 53. When the solenoid drive is activated and the solenoid coil is energized, the current through the solenoid coil will be detected through the solenoid drive circuit of block 59 via lead 63 and fed to the cusp detector circuit of block 65. The cusp detector of block 65 will detect the time of seating of the solenoid plunger or armature of the solenoid of block 53, and will generate a pulse indicative of the seating. This pulse indicative of the solenoid having seated is transmitted over lead 67 to the control logic circuit of block 69. The control logic of block 69 receives input signals over input 71 to indicate the system's need for the energization or de-energization of the solenoid of block 53 and controls the actuation or or de-actuation of the solenoid drive circuit of block 59 via lead 73. The control logic of block 69 also contains the fault anticipation or detection logic of the present invention, and the fault indicator block 75 responds to signals from the control logic of block 69 via lead 77 to provide an indication of a fault and/or the nature of a particular fault depending on the nature of the overall system. The input 71 of the control logic of block 69 is representative of a number of actual input leads and may be used to receive the acceptable interval-establishing pulse as well as the solenoid energization pulse as explained hereinafter with respect to FIGS. 7 and 8.

Figure 6:
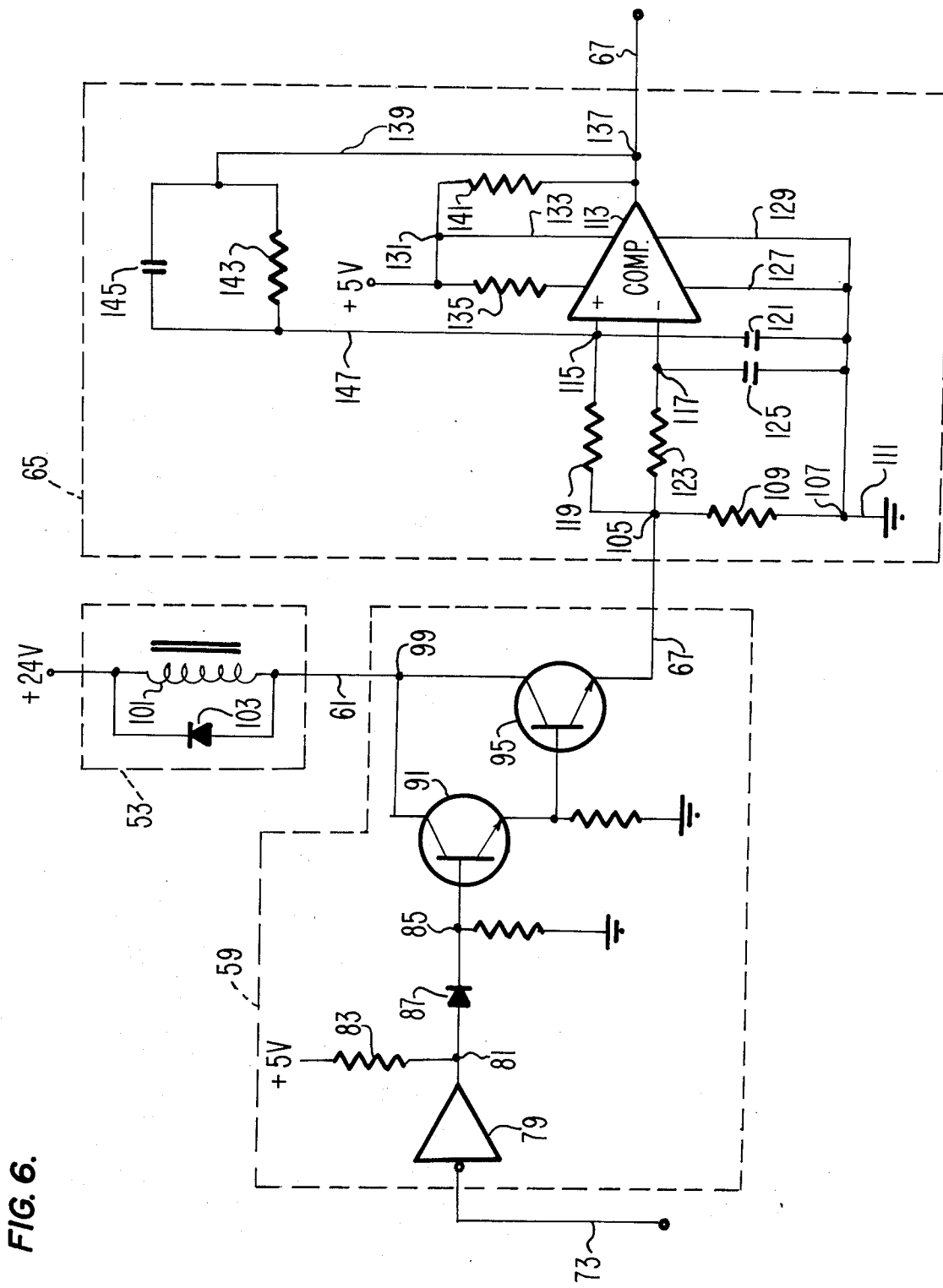
FIG. 6 shows a schematic diagram of a portion of the block diagram of FIG. 5.

FIG. 6 represents a schematic diagram of the solenoid drive circuit of block 59 of the circuit of FIG. 5, the solenoid coil of the solenoid represented by block 53, and the cusp detector circuit of block 65 of FIG. 5. The solenoid drive circuit of block 59 receives its input from the control logic of block 69 via lead 73. Lead 73 is connected to the input of an inverter 79 whose output is connected to node 81. Node 81 is connected to a +5 volt source of potential through a resistor 83 and to a node 85 through a diode 87 whose anode is connected to node 81 and whose cathode is connected to node 85. Node 85 is connected to ground through a resistor 89 and to the base of a transistor 91. The emitter of transistor 91 is connected to a node 93 which is connected directly to the base of a second switching transistor 95 and through a resistor 97 to ground. The collector of transistor 91 is connected to the collector of transistor 95 at node 99. Node 99 is coupled to the solenoid of block 53 via lead 61 and the emitter of transistor 95 is connected to the input of the cusp detector circuit of block 65 via lead 67. The solenoid of block 53 includes a solenoid coil 101 having one end coupled to lead 61 and the other end coupled to a +24 volt source of D.C. potential. Block 53 is also shown as including a diode 103 which is connected across the solenoid coil 101 such that its anode is connected to the lead 61 and its cathode is connected to the +24 volt source of D.C. potential.

The cusp detector circuit of block 65 receives its input from lead 67 at input node 105. Input node 105 is coupled to a node 107 via a current sensing resistor 109. The node 107 is coupled directly to ground through lead 111 such that when the transistor switch comprising transistors 91 and 95 is conductive, a series current path is established from the +24 volt D.C. source of potential through the solenoid coil 101, lead 61, node 99, the transistor switch comprising transistors 91 and 95, lead 67, node 105, the current-sensing resistor 109, node 107, and lead 111 to ground. The current-sensing resistor 109 is therefore inserted into the series current path which is used to energize the solenoid coil 101 such that the current flowing through the current-sensing resistor 109 represents the current flowing through the solenoid coil 101.

The cusp detector circuitry of block 65 further includes a differential voltage comparator 113 having a positive and negative input. The positive comparator input is taken from a first input node 115 and the negative input is taken from a second comparator input node 117. The first comparator input node 115 is coupled to the input node 105 through a first comparator input resistor 119 and is coupled to the node 107 through a first comparator input capacitor 121. The combination of the first comparator input resistor 119 and the first comparator input capacitor 121, which are connected across the current-sensing resistor 109, has a first characteristic RC time constant. The second comparator input node 117 is connected to the input node 105 through a second comparator input resistor 123 and is connected to the node 107 through a second comparator input capacitor 125. The second input capacitor 125 provides some measure of noise immunity but could be eliminated under certain conditions. The second comparator input resistor 123 and the second comparator input capacitor 125 are also coupled across the current-sensing resistor 109 and have a second characteristic RC time constant which is different from the RC time constant of the combination of the first comparator input resistor 119 and the first comparator input capacitor 121. The first input resistor capacitor combination 119, 121 forms a ratio with the second input resistor-capacitor combination 123, 125 such that the two combinations respond to the changes in the voltage dropped across the current-sensing resistor 109 as the current in the solenoid coil 101 varies so as to establish a varying differential input voltage between input nodes 115 and 117 of the differential voltage comparator 113. The values of the comparator input resistors 119 and 123 and the comparator input capacitors 121 and 125 could be varied to obtain varying degrees of accuracy over varying ranges of operation as known in the art.

The negative power supply inputs of the differential voltage comparator 113 are connected to the node 107 via leads 127 and 129 respectively. The positive power supply inputs of the comparator 113 are coupled to a node 131 via lead 133 and via a resistor 135. The resistor 135 is used to provide a positive offset such that the output of the comparator is sure to be high although no voltage differential is present at the inputs 115 and 117. Node 131 is connected directly to a +5 volt source of potential. The output of the comparator 113 is taken from the comparator output node 137 which is directly connected via lead 67 to the control logic of block 69 of FIG. 5 and which is connected to node 131 via a pull-up resistor 141. A feedback network comprising the parallel combination of a feedback resistor 143 and a feedback resistor 145 has one end connected to the output node 137 via lead 139 and the other end coupled to the first comparator input node 115 via lead 147.

Figure 7:
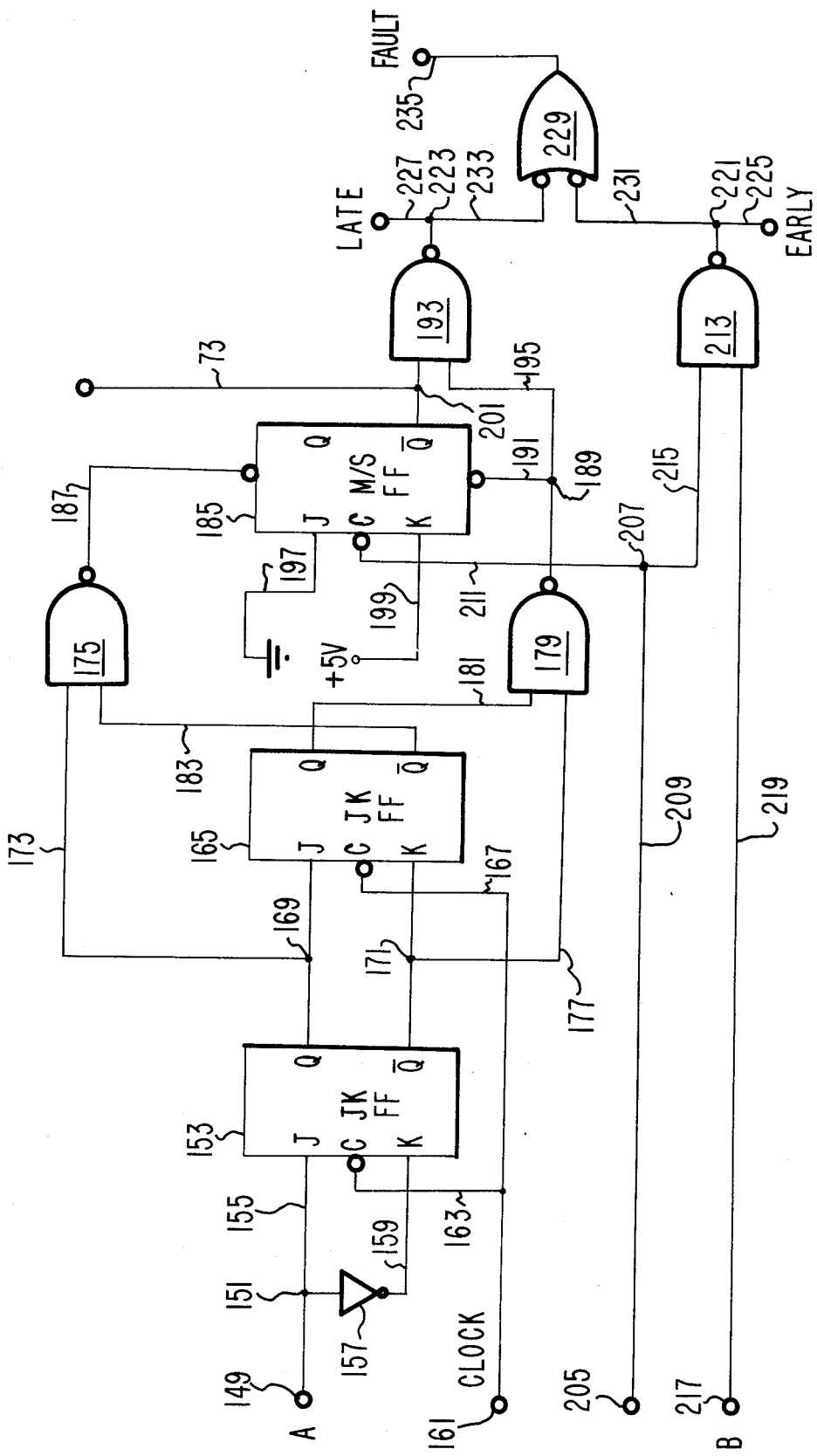
FIG. 7 shows a schematic diagram of the control logic and fault detection portion of the block diagram of FIG. 5.

The control logic of block 69 is shown in the schematic diagram of FIG. 7. A first input 149 receives the signal A which represents a "set" pulse from the external system and which indicates a need for energizing the solenoid of block 53. This input is connected directly to an input node 151 which is connected directly to the J input of a JK flip-flop 153 via lead 155 and to the K input of JK flip-flop 153 via inverter 157 and lead 159. A second input to the control logic of FIG. 7 is taken from input 161 which receives a series of clock pulses from a source of clock pulses such as a 250KC master clock, not shown but well-known in the art. These clock pulses are supplied from the input 161 to the clock input of JK flip-flop 153 via lead 163 and to the clock input of a second JK flip-flop 165 via lead 167. The Q output of JK flip-flop 153 is taken from node 169 and is connected directly to the J input of JK flip-flop 165. The $\overline{Q}$ output of JK flip-flop 153 is taken from node 171 and supplied directly to the K input of JK flip-flop 165. The node 169 is also connected via lead 173 to one input of a NAND gate 175 and the node 171 is connected via lead 177 to one input of a second NAND gate 179. The Q output of JK flip-flop 165 is connected to the second input of NAND gate 179 via lead 181 and the $\overline{Q}$ output of JK flip-flop 165 is connected to the second input of NAND gate 175 via lead 183. The output of NAND gate 175 is connected to the "dominant set" input of a master/slave JK flip-flop 185 via lead 187 and the output of NAND gate 179 is connected to a node 189. Node 189 is connected to the "dominant clear" input of master/slave JK flip-flop 185 via lead 191 and to one input of a NAND gate 193 via lead 195. The J input of the master/slave Jk flip-flop 185 is connected directly to ground via lead 197 and the K input is connected to a +5 volt source of potential via lead 199. The $\overline{Q}$ output of the master/slave JK flip-flop 185 is used as the sole output of the master/slave flip-flop 185 and is taken from output node 201. Output node 201 is connected to the second input of NAND gate 193 via lead 203 and may be connected to the input of the solenoid drive circuit of FIG. 6 via lead 73 to control the operation of the solenoid drive circuit as discussed in our copending patent application Ser. No. 550,597 filed on Feb. 18, 1975, now U.S. Pat. No. 3,946,285, and assigned to the assignee of the present invention.

A third input to the control logic of FIG. 7 is taken from input terminal 205 which receives the output signal from node 137 of the circuit of the cusp detector of FIG. 6 via lead 67. Input terminal 205 is connected to node 207 via lead 209, and node 207 is connected to the third or clock input of the master/slave JK flip-flop 185 via lead 211 and to one input of a NAND gate 213 via lead 215. The fourth and final input terminal of the control logic of FIG. 7 is taken from input terminal 217 and receives the time interval establishing pulse B described hereinafter with respect to FIG. 8. Input 217 is connected to the second input of NAND gate 213 via lead 219. The output of NAND gate 213 is taken from output node 221, and the output of NAND gate 193 is taken from node 223. Node 221 may be connected to an indicator circuit, as represented by block 75 of FIG. 5, as known in the art, via lead 225 and the node 223 may be connected to a similar indicator circuit, such as block 75 of FIG. 5, via lead 227. The signal from lead 225 could, for example, illuminate a light indicative of early seating of the solenoid and the signal on lead 227 could cause the indicator 75 to illuminate a message indicative of the late seating of the solenoid. The output 221 is also connected to one inverted input of an OR gate 229 via lead 231 and the node 223 is connected to the other inverted input of OR gate 229 via lead 233. The output of the OR gate may be connected to an indicator such as represented by block 75 via lead 235 and used to provide an indication that some type of fault, either an early seating or a late seating, has occurred.

Figure 8:
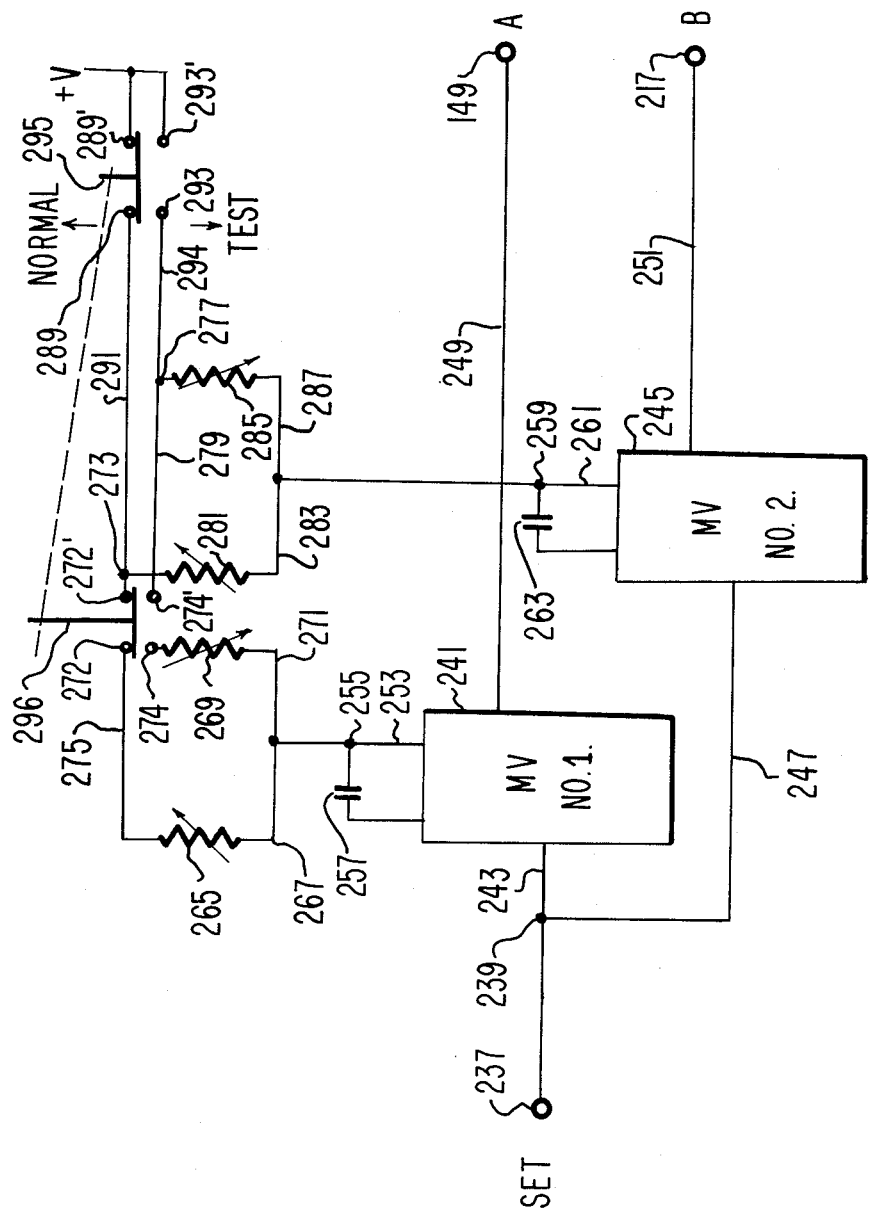
FIG. 8 shows a schematic diagram of a circuit used to generate a solenoid energization pulse and establish and control the predetermined acceptance time interval.

FIG. 8 shows a schematic diagram of one method of generating the set pulse A and the second pulse B used to establish the predetermined time interval during which the seating of the solenoid plunger or armature will be regarded as acceptable. A "set" input 237 receives a set signal from the external system indicating a need for energizing the solenoid of block 53. This signal is transmitted from input 237 to node 239 and thence to the input of a first monostable or one-shot multivibrator 241 via lead 243 and to the input of a second monostable or one-shot multivibrator 245 via lead 247. The output of the first monostable multivibrator 241 is supplied via lead 249 to the A or set input terminal 149 of the circuit of FIG. 7 and the output of the second monostable multivibrator 245 is supplied via lead 251 to the B pulse input terminal 217 of the circuit of FIG. 7. The pulse-duration-establishing inputs of monostable multivibrator 241 are connected to node 255 via a direct connection through lead 253 and via a capacitive connection through capacitor 257. The pulse-duration-establishing inputs of monostable multivibrator 245 are connected to node 259 directly via lead 261 and capacitively via capacitor 263. Node 255 is connected to a first variable resistor 265 via lead 267 and to a second variable resistor 269 via lead 271. The opposite end of resistor 265 is connected to switch contact 272 via lead 275 and the corresponding switch contact 272' is connected to a node 273. The opposite end of resistor 269 is connected to switch contact 274 and the corresponding switch contact 274' is connected to a node 277 via lead 279.

Node 259 is connected to one end of a variable resistor 281 via lead 283 and to one end of a second variable resistor 285 via lead 287. The other end of the resistor 281 is connected to node 273 and the opposite end of resistor 285 is connected to the node 277. Node 273 is connected to contact point 289 via lead 291 and node 277 is connected to a second contact point 293 via lead 294. The contact 289' which corresponds to contact 289 and the contact 293' which corresponds to the contact 293 are connected directly to a +5 volt source of potential. A movable switch 295 is positionable in a first or normal position to establish a conductive path between contacts 289 and 289' but is positionable in a test mode position to break this path and establish a conductive path between contacts 293 and 293'. Similarly, a movable switch 296 which is slaved to move with switch 295 is positionable in a first or normal position to establish a conductive path between corresponding switch contacts 272 and 272' but which is switchable to a test mode position to break this conductive path and establish a conductive path between the corresponding switch contacts 274 and 274'.

Figure 9:
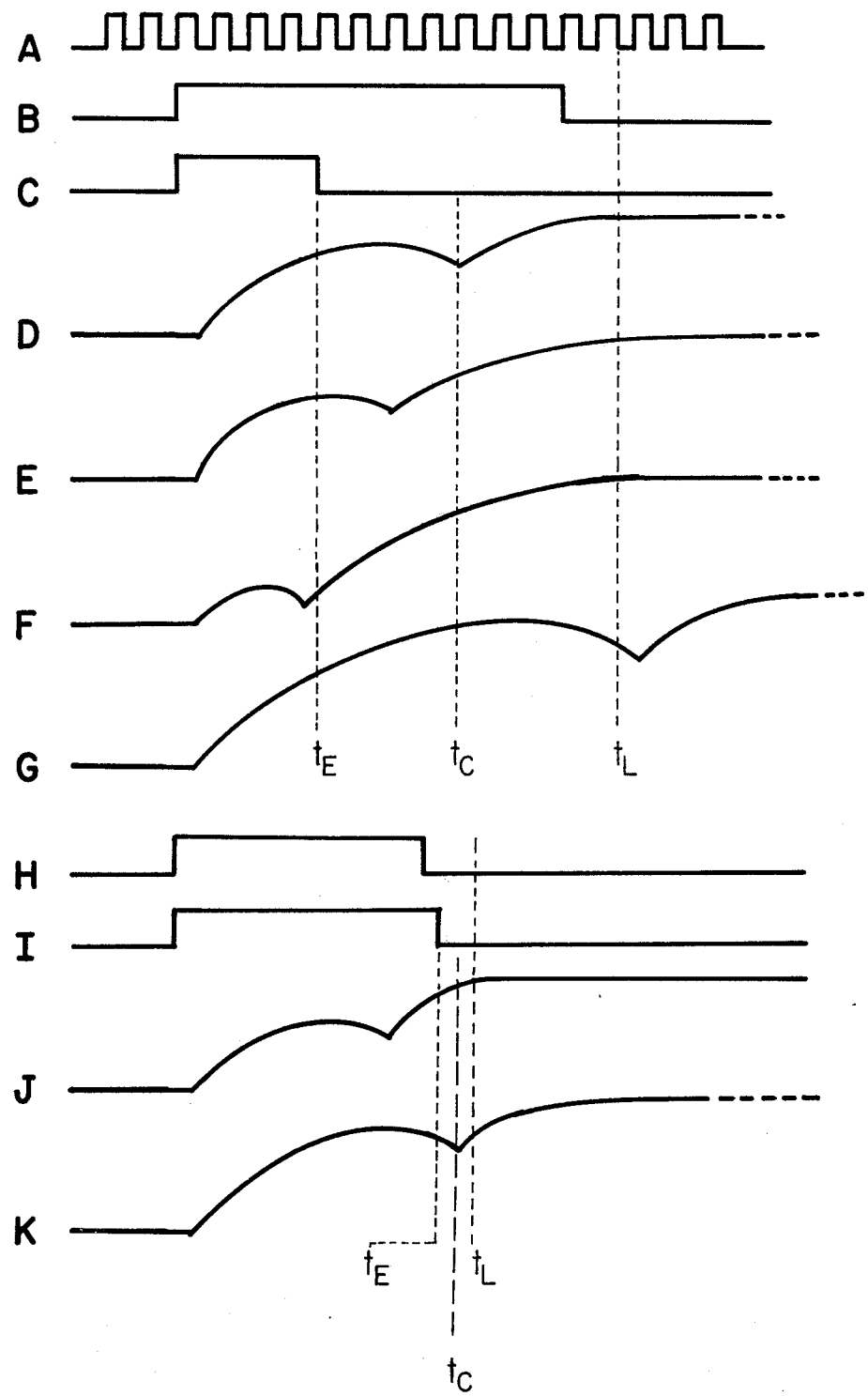
FIGS. 9A–K show a timing diagram for use in understanding the operation of the circuits of FIGS. 7 and 8.

FIG. 9 shows a timing diagram useful in understanding the operation of the circuits of FIGS. 7 and 8. Line 5A represents a pulse train of clock pulses such as might be applied to clock input 161 of the circuit of FIG. 7. Line 9B represents the set pulse A which is taken from the output of the first monostable multivibrator 241 of the circuit of FIG. 8 and supplied via lead 249 to the A pulse input 149 of the circuit of FIG. 7. Line 9C represents the pulse output of the second monostable multivibrator 245 which is transmitted via lead 251 to the B pulse input 217 of the circuit of FIG. 7. A first dotted vertical line begins with the trailing edge of the B pulse shown on line 9C and extends vertically downward. This dotted vertical line is labeled $T_E$ which stands for the earliest time during which the detection of a cusp indicative of the seating of the solenoid plunger or armature will be deemed to be acceptable. The vertical line beginning with the trailing edge of the A pulse shown on line 9B is labeled $T_L$ and represents the latest time at which the detection of a cusp indicative of the solenoid seating will be regarded as acceptable. The midway point is given by the vertical dotted line labeled $T_C$ and represents the correct time or the exact time at which the solenoid is desired to seat. This path does not necessarily need to be midway between the $T_E$ and $T_L$ times but is so indicated for illustrative purposes only. The waveform of line 9D shows that the current through the solenoid coil (through sensing resistor 109) begins to build on the trailing edge of the first clock pulse to occur after the leading edge of the A pulse arrives at the input node 151 of JK flip-flop 153 since it is this clock pulse which sets the flip-flop and causes the output of NAND gate 175 to dominantly set the master/slave JK flip-flop 185 so as to energize the solenoid 53. The cusp which is indicative of the time at which the solenoid plunger or armature seats occurs at the desired time $T_C$ within the predetermined acceptable time range established between $T_E$ and $T_L$. The waveform of line 9E shows a waveform of the current through the solenoid coil and it will be observed that the cusp indicative of solenoid seating has occurred earlier than the exact desired time $T_C$ but later than the time $T_E$ such that seating will be deemed to have occurred within the acceptable range. Line 9F shows a waveform for the situation wherein the solenoid has seated before the time $T_E$. This indicates an early seating and will result in an indication of an early seating fault as hereinafter explained. The waveform of line 9G indicates the waveform of the current through the solenoid coil for a late seating and for which a late seating fault indication signal will be given as hereinafter explained.

The waveforms of timing lines 9H–9K represent the waveforms for operation during the test mode in which the switch members 295 and 296 are positioned from the normal mode position to the test mode position so as to establish a conductive path between contacts 293 and 293' and between contacts 274 and 274' so as to introduce resistors 269 and 285 into the pulse-width-establishing networks of monostable multivibrators 241 and 245 respectively. It will be observed that the width of the acceptable range has been greatly narrowed. The waveform of line 9H shows the output of the first monostable multivibrator 241 or the A pulse which is supplied to input 249 of the circuit of FIG. 7 and line 9I represents the output of the second monostable multivibrator 245 which provides the B pulse to input 217 of the circuit of FIG. 7. Line 9J represents a duplication of line 9E but since the cusp now occurs earlier than the outermost early limit of our predetermined time interval, it will be observed that the solenoid is not seating at exactly the proper time. Maintenance adjustments can be made to cause the solenoid to seat properly as shown in the waveform of line 9K at exactly the desired time. It will be observed that although the waveform of line 9J showed that seating was inside the normal acceptable range so that a fault would not be flagged, it can be assumed, since the solenoid was not seating at exactly the proper time, that a tendency toward a future failure was detected. Therefore, a possible future fault has been anticipated and can be averted by adjustments before an actual failure ever occurs.

Briefly, the operation of the system of the present invention will be described with reference to FIGS. 6–9. In normal operation, switches 295 and 296 are normally positioned to establish a current path between the +5 volt source of potential and through contacts 289 aand 289' and contacts 272 and 272' so that the resistors 265 and 281 are connected to the first monostable multivibrator 241 and to the second monostable multivibrator 245, respectively. This results in the generation of a set pulse A having a first predetermined pulse length and a second pulse B which has a second predetermined pulse length. The A pulse is applied to input 149 of FIG. 7 and the B pulse is supplied to the input 217 of FIG. 7. The presence of a high at the J input of JK flip-flop 153 will cause the Q output to go high on the trailing edge of the next clock pulse. This high is supplied to one input of NAND gate 175. Since the other input of NAND gate 175 is connected to the $\overline{Q}$ output of the second JK flip-flop 165, which remains high until the occurrence of the next clock pulse on lead 167, which will set the second JK flip-flop 165, the output of NAND gate 175 will go low and be transmitted via lead 187 to the "dominant set" input of master/slave JK flip-flop 185. This will cause the master/slave Jk flip-flop 185 to dominately set and will override any attempt of a clocking pulse from the output of the cusp detector via lead 67 to reset the circuit. As soon as the master/slave JK flip-flop 185 is dominately set, the $\overline{Q}$ output goes low and this signal is transmitted via lead 73 to the input of inverter 79. The output of the inverter goes high causing the transistor 91 to switch to a conductive state. The conduction of transistor 91 causes the base of transistor 95 to go high, switching transistor 95 to a conductive state. With transistors 91 and 95 conducting, a current path is established between the +24 volt source of potential, through the solenoid coil 101, through the switching transistors 91 and 95, and through the current sensing resistor 109 to ground. As soon as this current path is established, the solenoid coil 101 is energized and current begins to build in the solenoid as described in our copending application cited previously. The ratio establishing network which is connected across the current-sensing resistor 109 responds to the changing voltage dropped across the current-sensing resistor 109 to cause the output of the comparator to go low as soon as current begins to build in the solenoid coil. The output will remain low as the current continues to build in the solenoid coil. At some point, the solenoid coil will begin to draw the armature or plunger further into the coil toward the seated position. As the plunger is drawn even further into the coil, a point will be reached at which the reluctance is changing faster than current is able to build in the system, causing the current developed in the coil to begin to fall. The ratio establishing network at the input of the comparator 113 will sense a lessening of the current flowing through the current-sensing resistor 109 and cause the output of the comparator 113 to again go high. this persists so long as the current is falling, but as soon as the plunger has seated, the reluctance is no longer changing and the current is once more able to build in the coil. As soon as the current begins to build, the ratio establishing network at the input of the comparator 113 senses the increase in the current through the sensing resistor 109 and causes the output of the comparator 113 to again go low. The transition which takes place at the output of the comparator 113 as the reluctance changes at a sufficient rate to cause a decrease in the current and then an increase once the solenoid has seated and the reluctance has stopped changing, generates a cusp-indicative pulse or a pulse indicative of the plunger or armature having seated and this pulse is transmitted via lead 67 to input 205 of the circuit of FIG. 7. This pulse if transmitted to the clock input of the master/slave JK flip-flop 185 and causes the master/slave flip-flop to be reset since the K input is connected to a +5 volt source of potential while the J input is grounded. This causes the $\overline{Q}$ output of the master/slave JK flip-flop 185 to go high, and this high is transmitted via lead 73 to the solenoid drive circuit of block 59 and inverted in inverter 79 to switch the switching transistors 91, 95 to a non-conductive state so as to break the current path and cause de-energization of the solenoid coil 101, as explained in the above reference copending application.

Assume, for the sake of explanation, that lead 73 could be disconnected from node 201 (without disabling the circuit) in such a way that the resetting of the master/slave JK flip-flop 185 in response to the arrival of the cusp indicative pulse at its clock input will not cause the solenoid drive circuit of block 59 to switch transistors 91 and 95 to a non-conductive state so as the break the current path and de-energize the solenoid at the time of seating. The cusp-indicative pulse is received at node 205 and used to reset the master/slave JK flip-flop 185 and is transferred via node 207 and lead 215 to one input of NAND gate 213. Since the other input of NAND gate 219 is taken from terminal input 217, which receives the B pulse from the output of the second monostable multivibrator 245, the presence of the B pulse of the second input of NAND gate 213 will operate to enable the gate. Since the trailing edge of the B pulse, as shown in FIG. 9, line C, determines the earliest point in time at which the occurrence of a solenoid seating-indicative pulse will be deemed to be acceptable occurs at the termination of the pulse, then any solenoid-seating indicative pulse which arrives at the first input of NAND gate 213 while the second input is enabled by the presence of a high B pulse, then the output of NAND gate 213 will go low only when the cusp-indicative pulse occurs too early. The presence of a negative pulse at node 221 may be used to signal an early seating error to an indicator or the like via lead 225 and/or fed via lead 231 to one inverted input of OR gate 229 causing the OR gate 229 to generate a high signal on lead 235 which could be used to trigger a fualt indication at an indicator 75.

The fault detector operates to sense a late occurrence in a similar manner. After the solenoid has been energized as previously described, the trailing edge of the A or set pulse which was applied to input 149 will cause the signal present at the J input of JK flip-flop 153 to again go low and the signal at the K input of JK flip-flop 153 to go high. The next clock pulse will cause the $\overline{Q}$ output of JK flip-flop 153 to go high as the flip-flop is reset. Since the second JK flip-flop 165 does not reset until the occurrence of the next clock pulse, the Q output of JK flip-flop 165 remains high until the occurrence of the next clock pulse, hence momentarily, both inputs of NAND gate 179 are high causing the output to go low. The low output of NAND gate 179 is taken from node 189 and used to trigger a dominant clear of the master/slave JK flip-flop 185 causing the $\overline{Q}$ output to go high. When the next clock pulse causes JK flip-flop 165 to reset, the Q output of JK flip-flop 165 goes low, causing the output of NAND gate 179 to again go high. When this high arrives at the second input of NAND gate 193, its output goes low indicating a late seating since the cusp-indicative pulse did not occur before the termination of a predetermined time interval after the initial energization. This low, indicative of the late seating of the solenoid plunger may be transmitted to an indicator circuit 75 via lead 227 and/or may be supplied to the second inverted input of OR gate 229 causing a fault-indicative high to appear at the output which may be transmitted via lead 235 to an indicator 75 for indicating that a fault has occurred. It will, therefore, be observed that if either a later seating or an early seating occurs, a fault-indicative pulse will appear on lead 235 and, the option exists for determining whether it is a late seating or an early seating by monitoring leads 227 and 225 respectively.

In the test mode, it will be readily observed that the positioning of the switches 295 and 296 to establish a current path between contacts 293 and 293' and between 274 and 274' will insert a different pair of pulse width-establishing resistors into the system of FIG. 8 causing the pulse duration of the A pulse and B pulse to be varied so as to compress the acceptable range around the desired seating time. As described above, the trailing edge of the B pulse establishes the earliest time at which the occurrence of a seating-indicative pulse will be deemed to be acceptable, and the latest time at which a seating-indicative pulse will be deemed to be acceptable is established in relation to the trailing edge of the A pulse. The latter limit is not coincident with the trailing edge but occurs on the trailing edge of the second clock pulse to occur after the A signal goes low. This is due to the fact that the first clock signal after the A signal goes low resets the JK flip-flop 153 and the second clock pulse resets the JK flip-flop 165. It takes the resetting of the second JK flip-flop 265 to cause the output of NAND gate 179 to again go high and trigger the output of NAND gate 193.

It will, therefore, be seen that the present invention enables the detection of either an early seating or a late seating and it will be readily observable to those skilled in the art, that knowing the type of utilization which is being made of the solenoid, an indication of an early seating or late seating can be used to diagnose or predict the probable nature of the fault which caused the early or late seating. The ability to switch to a test mode and greatly reduce the range of acceptability enables an operator to sense a tendency toward a future failure or to anticipate a possible future failure since minor variations which are likely to continue and result in possible future failures can be detected and adjustments can be made to restore the system to its proper seating time.

Although specific apparatus has been shown for the purpose of describing applicant's invention, it will be apparent to those skilled in the art that other variations and modifications in the specific structures and circuits illustrated, may be made without departing from the scope and spirit of the present invention which is limited only by the appended claims.

We claim:

1. A fault detection system for use in a system employing a solenoid, said fault detection system comprising:

means for detecting the seating of said solenoid including current-sensing resistor means coupled to the coil of said solenoid for sensing the current flowing therein, and means responsive to the characteristic cusp in the waveform of the current flowing in said current-sensing resistor means which occurs in response to the seating of said solenoid for generating a digital output signal indicative of the detection of the seating of said solenoid comprising differential voltage comparator means having a first and second input and a comparator output, first resistor-capacitor means coupled to the first input of said differential voltage comparator means and coupled across said current-sensing resistor means, said first resistor-capacitor means having a first RC time constant, second resistor-capacitor means coupled to the second input of said differential voltage comparator means and coupled across said current-sensing resistor means, said second resistor-capacitor means having a second characteristic RC time constant such that the ratio of said first resistor-capacitor means to said second resistor-capacitor means establishes a differential voltage ratio between said first and second inputs of said differential voltage comparator means, and feedback means coupled between said comparator output and said first input for preventing oscillations and reducing susceptibility to noise, and wherein said differential voltage comparator means is responsive to the changes in the polarity of the differential voltage ratio established between said first and second input which occurs in response to a cusp in the waveform of the current flowing through said current-sensing resistor means for generating said digital signal indicative of the detection of the seating of said solenoid at said comparator output;

means for establishing a predetermined time interval during which the detected seating of said solenoid will be deemed to be acceptable; and means responsive to the detection of a solenoid seating outside of said predetermined time interval for passing a signal indicative of the occurrence of a fault.

2. A method of detecting and preventing the occurrence of solenoid seating-related system failures comprising the steps of:

determining a desired time of seating of a solenoid armature or plunger;

generating a signal indicative of the actual time of seating of the solenoid armature or plunger;

establishing a predetermined interval of time about said determined desired seating time such that the occurrence of said generated signal within said established interval of time will be deemed to be acceptable;

detecting the generation of said seating-indicative signal outside of said established predetermined interval of time for indicating that a solenoid-seating related system failure has occurred;

compressing said established predetermined interval of time to a narrow range about said determined desired time of seating;

detecting a time of seating of the solenoid armature or plunger which was previously within the established predetermined interval of time but which is currently outside of the compressed interval of time for determining that while a solenoid-seating related system failure has not yet occurred, a tendency toward such a failure may be anticipated; and adjusting the seating time of said solenoid armature or plunger to within said compressed interval of time to prevent the possible future solenoid seating-related system failure.

* * * * *